(12) United States Patent
Zhang

(10) Patent No.: US 9,083,357 B2
(45) Date of Patent: Jul. 14, 2015

(54) FREQUENCY LOCKING SYSTEM

(71) Applicant: IPGoal Microelectronics (Sichuan) Co., Ltd., Chengdu, Sichuan (CN)

(72) Inventor: Ziche Zhang, Sichuan (CN)

(73) Assignee: IPGoal Microelectronics (Sichuan) Co., Ltd., Chengdu, Sichuan Province (CN)

( * ) Notice: Subject to any disclaimer, the term of this patent is extended or adjusted under 35 U.S.C. 154(b) by 0 days.

(21) Appl. No.: 14/515,396

(22) Filed: Oct. 15, 2014

(65) Prior Publication Data

US 2015/0030114 A1    Jan. 29, 2015

(30) Foreign Application Priority Data

Apr. 18, 2014    (CN) .......................... 2014 1 0158425

(51) Int. Cl.
*H03L 7/089* (2006.01)
*H03L 7/091* (2006.01)
*H03L 7/097* (2006.01)
*H04L 7/033* (2006.01)

(52) U.S. Cl.
CPC .............. *H03L 7/0891* (2013.01); *H03L 7/091* (2013.01); *H03L 7/097* (2013.01); *H04L 7/0331* (2013.01)

(58) Field of Classification Search
CPC ......... H03L 7/081; H03L 7/097; H03L 7/089; H03L 7/091; H03L 7/095; H04L 7/0331
See application file for complete search history.

(56) References Cited

U.S. PATENT DOCUMENTS

| 2002/0003453 A1* | 1/2002 | Segawa et al. .................. 331/14 |
| 2003/0113122 A1* | 6/2003 | Koga ............................ 398/155 |
| 2008/0143394 A1* | 6/2008 | Payrard et al. ................ 327/140 |
| 2010/0208857 A1* | 8/2010 | Chen et al. .................... 375/376 |
| 2014/0177771 A1* | 6/2014 | Maruko et al. ................ 375/375 |
| 2014/0292387 A1* | 10/2014 | Dasgupta et al. ............. 327/157 |

* cited by examiner

*Primary Examiner* — Aristocratis Fotakis

(57) ABSTRACT

A frequency locking system for locking a clock frequency in a CDR circuit without crystal oscillator is provided. Reference data information is inputted into a first low-pass filter; the first low-pass filter is connected to a first swing detector; the first swing detector is connected to a non-inverting terminal of a comparator; an output terminal of the comparator is connected to a charge pump; the charge pump is connected to a first terminal of a capacitor; the capacitor is grounded. The capacitor is also connected to a voltage-controlled oscillator; the voltage-controlled oscillator is connected to a code pattern conversion generator; the code pattern conversion generator is connected to of a second low-pass filter; the second low-pass filter is connected to an input terminal of a second swing detector; an output terminal of the second swing detector is connected to an inverting terminal of the comparator.

5 Claims, 1 Drawing Sheet

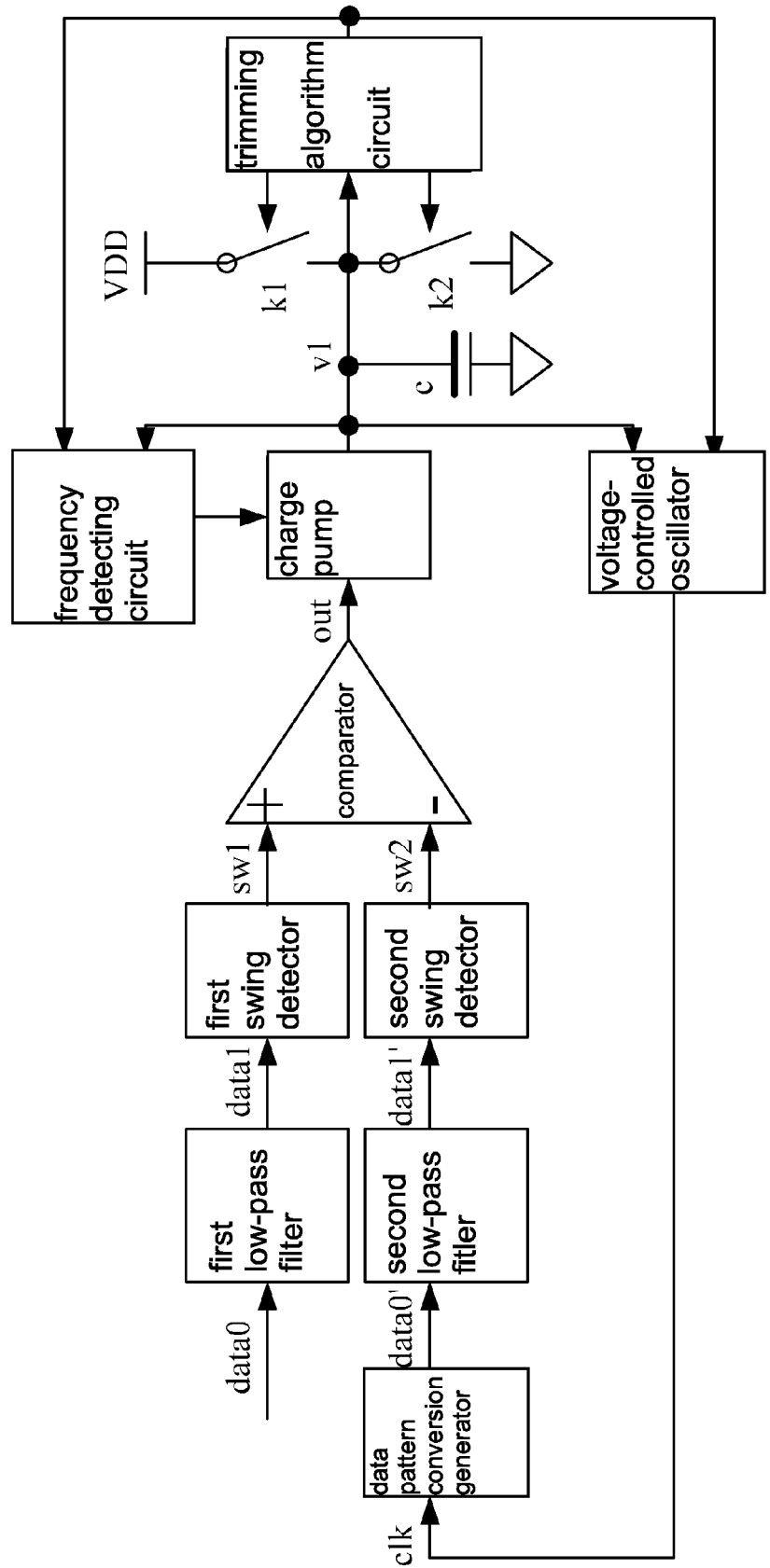

FREQUENCY LOCKING SYSTEM

CROSS REFERENCE OF RELATED APPLICATION

This invention claims priority under 35 U.S.C. 119(a-d) to CN 201410158425.5, filed Apr. 18, 2014.

BACKGROUND OF THE PRESENT INVENTION

1. Field of Invention

The present invention relates to semiconductor integrated circuits, and more particularly to a frequency locking system.

2. Description of Related Arts

The conventional digital frequency locking system usually adopts the locking manner of: dividing a unit data width into four sub-intervals by a two-phase quadrature clock edge; sampling the two-phase quadrature clock edge with a data edge, so as to obtain information about which specific sub-interval the data edge falls into, and recording the sampled information; comparing the sampled information with previous sampled information, and detecting out frequency difference information if the sub-interval where the data edge falls changes continuously. The locking manner has following defects. Firstly, when the data edge samples the clock, high-speed data require a tight sequence of a sampler. Secondly, the quadrature clock edge divides the unit data width into the four sub-intervals; the frequency detection requires the continuous changes of the sub-interval, so an absolute value of an error between an initial frequency and a reference frequency must be smaller than 25%, which leads to a small locking range for the frequency to fall into. Thirdly, the edge locking and determination manner is liable to induce locking a frequency multiplying point.

Thus it is necessary to provide an improved frequency locking system to overcome the above defects.

SUMMARY OF THE PRESENT INVENTION

An object of the present invention is to provide a frequency locking system which has a large locking range and excludes frequency multiplying points.

Accordingly, in order to accomplish the above object, the present invention provides a frequency locking system for locking a clock frequency in a clock and data recovery (CDR) circuit without crystal oscillator. The frequency locking system comprises a first low-pass filter, a first swing detector, a second low-pass filter, a second swing detector, a comparator, a charge pump, a voltage-controlled oscillator, a code pattern conversion generator and a capacitor. Reference data information is inputted into an input terminal of the first low-pass filter; an output terminal of the first low-pass filter is connected to an input terminal of the first swing detector; an output terminal of the first swing detector is connected to a non-inverting terminal of the comparator; an output terminal of the comparator is connected to an input terminal of the charge pump; an output terminal o the charge pump is connected to a first terminal of the capacitor; and, a second terminal of the capacitor is grounded. The first terminal of the capacitor is also connected to an input terminal of the voltage-controlled oscillator; an output terminal of the voltage-controlled oscillator is connected to an input terminal of the code pattern conversion generator; an output terminal of the code pattern conversion generator is connected to an input terminal of the second low-pass filter; an output terminal of the second low-pass filter is connected to an input terminal of the second swing detector; and, an output terminal of the second swing detector is connected to an inverting terminal of the comparator. The first swing detector detects an amplitude of the reference data information which is filtered by the first low-pass filter to generate a first detection result, and inputs the first detection result into the non-inverting input terminal of the comparator. The code pattern conversion generator converts clock information generated by the voltage-controlled oscillator into a code pattern correspondently to the reference data information, and inputs the converted clock information into the second low-pass filter. The second swing filter detects an amplitude of the clock information which is filtered by the second low-pass filter to generate a second detection result, and inputs the second detection result into the inverting input terminal of the comparator. The comparator compares amplitude values of the two inputted informations to generate a comparison result. The comparison result of the comparator controls the charge pump to charge/discharge the capacitor. The voltage-controlled oscillator adjusts a frequency of the clock information which is outputted thereby, according to voltages of two ends of the capacitor.

Preferably, the frequency locking system further comprises a trimming algorithm circuit. An input terminal of the trimming algorithm circuit is connected to the first terminal of the capacitor; an output terminal of the trimming algorithm circuit is connected to a control terminal of the voltage-controlled oscillator, for adjusting a frequency range of the clock information which is outputted by the voltage-controlled oscillator. The trimming algorithm circuit has N scales, wherein N is a natural number larger than or equal to 1. When the trimming algorithm circuit detects that the voltages of the two ends of the capacitor are increased to a highest level due to charging, or reduced to a lowest level due to discharging, the trimming algorithm circuit accordingly switches the scales to adjust the frequency range of the clock information outputted by the voltage-controlled oscillator.

Preferably, when the trimming algorithm circuit detects that the voltages of the two ends of the capacitor are increased to the highest level due to charging, the trimming algorithm circuit raises the current scale by one scale; when the trimming algorithm circuit detects that the voltages of the two ends of the capacitor are reduced to the lowest level due to discharging, the trimming algorithm circuit lowers the current scale by one scale.

Preferably, the frequency locking system further comprises a first switch and a second switch. A first terminal of the first switch is connected to an external power source, and a second terminal of the first switch is connected to the first terminal of the capacitor. A first terminal of the second switch is grounded, and a second terminal of the second switch is connected to the first terminal of the capacitor. Control terminals of the first switch and the second switch are both connected to the trimming algorithm circuit. When the trimming algorithm circuit is raising the scale, the first switch is opened and the second switch is closed. When the trimming algorithm circuit is lowering the scale, the first switch is closed and the second switch is opened.

Preferably, the frequency locking system further comprises a frequency detecting circuit. A first input terminal of the frequency detecting circuit is connected to the output terminal of the trimming algorithm circuit; a second input terminal of the frequency detecting circuit is connected to the first terminal of the capacitor; and, an output terminal of the frequency detecting circuit is connected to a control terminal of the charge pump. When the frequency detecting circuit detects that the scale of the trimming algorithm circuit stops switching and the voltages of the two ends of the capacitor stops changing, the frequency detecting circuit shuts down the charge pump.

Compared with prior arts, in the frequency locking system of the present invention, the comparator compares the amplitude values of the two inputted informations, and the comparison result of the comparator controls the charge pump to charge/discharge the capacitor; the voltage-controlled oscillator adjusts the frequency of the clock information outputted thereby, according to the voltages of the two ends of the capacitor. As a result, by comparing the amplitudes of the two informations and accordingly adjusting the frequency of the clock information outputted by the voltage-controlled oscillator, the frequency of the clock information becomes equal to the frequency of the reference data information, so as to accomplish locking the frequency in a large frequency locking range and without any frequency multiplying point.

These and other objectives, features, and advantages of the present invention will become apparent from the following detailed description, the accompanying drawings, and the appended claims.

BRIEF DESCRIPTION OF THE DRAWINGS

The FIGURE is a block diagram of a frequency locking system according to a preferred embodiment of the present invention.

DETAILED DESCRIPTION OF THE PREFERRED EMBODIMENT

Referring to the drawings, a preferred embodiment of the present invention is illustrated. Like reference characters in the drawings indicate corresponding elements. As mentioned above, the present invention provides a frequency locking system which has a large frequency locking range and excludes frequency multiplying points.

Referring to the FIGURE, according to a preferred embodiment of the present invention, the frequency locking system is for locking a clock frequency in a CDR circuit without crystal oscillator. The frequency locking system comprises a first low-pass filter, a first swing detector, a second low-pass filter, a second swing detector, a comparator, a charge pump, a voltage-controlled oscillator, a code pattern conversion generator and a capacitor c. Reference data information, data0, is inputted into an input terminal of the first low-pass filter; the first low-pass filter filters the inputted reference data information data0, and outputs the reference data information data1 which is filtered. An output terminal of the first low-pass filter is connected to an input terminal of the first swing detector, for inputting the reference data information data1 into the first swing detector. The first swing detector detects an amplitude of the reference data information data1, and outputs a first amplitude information sw1 which is obtained by detecting. An output terminal of the first swing detector is connected to a non-inverting input terminal of the comparator, for inputting the first amplitude information sw1 into the non-inverting input terminal of the comparator. An output terminal of the voltage-controlled oscillator is connected to an input terminal of the code pattern conversion generator. The voltage-controlled oscillator generates a clock information clk, and inputs the clock information clk into the code pattern conversion generator. It is well known that the data information usually has a different code pattern with the clock information, wherein the clock information is a fixed periodic transition edge and the data information is a non-fixed periodic transition edge, which disenables to directly compare frequencies of the two informations having the two different code patterns. Therefore, the code pattern conversion generator of the present invention converts the clock information clk into a code pattern correspondently to the reference data information data0 and outputs the clock information data0', wherein the reference data information data0 have the same code pattern with the clock information data0'. An output terminal of the code pattern conversion generator is connected to an input terminal of the second low-pass filter, for inputting the clock information data0' into the second low-pass filter. The second low-pass filter filters the inputted clock information data0', and outputs the clock information data1' which is filtered. An output terminal of the second low-pass filter is connected to an input terminal of the second swing detector, for inputting the clock information data1' into the second swing detector. The second swing detector detects an amplitude of the clock information data1', and outputs a second amplitude information sw2 which is obtained by detecting. An output terminal of the second swing detector is connected to an inverting terminal of the comparator, for inputting the second amplitude information sw2 into the inverting terminal of the comparator. An output terminal of the comparator is connected to an input terminal of the charge pump. The comparator compares the first amplitude information sw1 with the second amplitude information sw2 to generate a comparison result out, and inputs the comparison result out into the input terminal of the charge pump. An output terminal of the charge pump is connected to a first terminal of the capacitor c, and a second terminal of the capacitor c is grounded; and thus, the comparison result out outputted by the comparator controls the charge pump to charge/discharge the capacitor c. Specifically, when sw1>sw2, the comparison result outputted by the comparator out=1, and herein the charge pump controls the capacitor c to discharge, in such a manner that voltages v1 of two ends of the capacitor c decrease; when sw1<sw2, the comparison result outputted by the comparator out=0, and herein the charge pump charges the capacitor c, in such a manner that the voltages v1 of the two ends of the capacitor c increase; when sw1=sw2, the frequency locking system is at a dynamic balance, and herein the charge pump controls the capacitor c to switch between charging and discharging. The first terminal of the capacitor c is connected to an input terminal of the voltage-controlled oscillator; in other words, the voltages v1 of the two ends of the capacitor c is an input voltage of the voltage-controlled oscillator, so that the voltage-controlled oscillator adjusts a frequency of the clock information clk outputted thereby according to changes of the voltages v1 of the two ends of the capacitor c. Specifically, when the voltages v1 increase, the frequency of the clock information clk outputted by the voltage-controlled oscillator increases; when the voltages v1 decrease, the frequency of the clock information clk outputted by the voltage-controlled oscillator decreases; an extent of increasing or decreasing is determined based on practical needs, and not illustrated in details herein. It is well known that an amplitude is inversely proportional to a frequency of the same signal; in the preferred embodiment of the present invention, the amplitude sw1 of the reference data information data0 is inversely proportional to a frequency, marked as f1, of the reference data information data0; the amplitude sw2 of the clock information clk is inversely proportional to the frequency, marked as p, of the clock information clk. As illustrated above, when sw1<sw2 (f1>f2), the capacitor c charges, the voltages v1 increase, and thus the frequency of the clock information clk outputted by the voltage-controlled oscillator increases, which is repeated for a few times until finally sw1=sw2 (f1=f2); when sw1>sw2

(f1<f2), the capacitor c discharges, the voltages v1 decrease, and thus the frequency of the clock information clk outputted by the voltage-controlled oscillator decreases, which is repeated for a few times until finally sw1=sw2 (f1=f2). As a result, the frequency locking system of the present invention adjusts the frequency of the clock information clk to be equal to the frequency of the reference data information data0, so as to accomplish locking the frequency in a large frequency locking range and without any frequency multiplying point.

In the preferred embodiment of the present invention, the frequency locking system further comprises a trimming algorithm circuit. An input terminal of the trimming algorithm circuit is connected to a first terminal of the capacitor c, and an output terminal of the trimming algorithm circuit is connected to a control terminal of the voltage-controlled oscillator, in such a manner that the trimming algorithm circuit controls a frequency range of the adjusted clock information clk outputted by the voltage-controlled oscillator. The trimming algorithm circuit has N scales for adjusting the frequency range of the clock information clk outputted by the voltage-controlled oscillator. N is a natural number larger than or equal to 1, wherein a value of N and a frequency range of each of the scales are set according to practical needs. Specifically, when the trimming algorithm circuit detects that the capacitor c charges to increase the voltages v1 to a highest level, namely the frequency of the clock information clk outputted by the voltage-controlled oscillator reaches a maximum value of the current scale, the frequency of the clock information clk is unable to increase any further; and then, the trimming algorithm circuit raises the current scale by one scale, so as to increase and change the frequency range of the clock information clk which the voltage-controlled oscillator is capable of outputting. For example, the current frequency range of the clock information clk which the voltage-controlled oscillator is capable of outputting is 20 MHz-40 MHz; when the capacitor c charges and the voltages v1 increase to a highest level, namely the frequency of the outputted clock information clk is 40 MHz, the trimming algorithm circuit raises the current scale by one scale so that the frequency range of the clock information clk which the voltage-controlled oscillator is capable of outputting changes into 40 MHz-60 MHz. Accordingly, when the capacitor c discharges and the voltages v1 decrease to a lowest level, namely the frequency of the clock information clk outputted by the voltage-controlled oscillator reaches a minimum value of the current scale, the frequency of the clock information clk is unable to decrease any lower; and then, the trimming algorithm circuit lowers the current scale by one scale, so as to decrease and change the frequency range of the clock information clk which the voltage-controlled oscillator is capable of outputting. Via switching the scales by the trimming algorithm circuit, the frequency of the clock information clk which the voltage-controlled oscillator finally outputs becomes equal to the frequency of the reference data information data0, so as to accomplish locking the frequency. Further, in the preferred embodiment of the present invention, the frequency locking system further comprises a first switch k1 and a second switch k2. A first terminal of the first switch k1 is connected to an external power source VDD; and, a second terminal of the first switch k1 is connected to the first terminal of the capacitor c. A first terminal of the second switch k2 is grounded; and, a second terminal of the second switch k2 is connected to the first terminal of the capacitor c. Control terminals of the first switch k1 and the second switch k2 are both connected to the trimming algorithm circuit. When the trimming algorithm circuit is raising the scale, the trimming algorithm circuit controls the first switch k1 to open and the second switch k2 to close, and thus the capacitor c discharges through the second switch k2, in such a manner that the voltages v1 of the two ends of the capacitor c recover to a voltage value before charging. Correspondingly, when the trimming algorithm circuit is lowering the scale, the first switch k1 is closed and the second switch k2 is opened, in such a manner that the voltages v1 of the two ends of the capacitor c recover to a voltage value before discharging. Through the first switch k1 and the second switch k2, when the trimming algorithm circuit switches the scales, which means that the frequency range of the clock information clk outputted by the voltage-controlled oscillator changes, the first switch k1 and the second switch k2 recover the voltages v1 of the two ends of the capacitor c to an initial value, so that the frequency of the clock information clk changes along with the voltages v1. Thus, the frequency locking system of the present invention is capable of continuously adjusting the frequency range of the clock information clk outputted by the voltage-controlled oscillator via cooperation with the multiple scales of the trimming algorithm circuit, and broadening the frequency locking range.

Besides, in the preferred embodiment of the present invention, the frequency locking system further comprises a frequency detecting circuit. A first input terminal of the frequency detecting circuit is connected to an output terminal of the trimming algorithm circuit; a second input terminal of the frequency detecting circuit is connected to the first terminal of the capacitor c; and, an output terminal of the frequency detecting circuit is connected to a control terminal of the charge pump, in such a manner that the frequency detecting circuit detects changes in the voltages v1 of the two ends of the capacitor c and the scales of the trimming algorithm circuit. Specifically, the frequency detecting circuit detects that the scale of the trimming algorithm circuit stops changing and the voltages v1 stop changing, which indicates that the trimming algorithm circuit has found the clock information clk which has the equal frequency to the reference data information data0 at the current scale, i.e., the current range of the clock frequency outputted by the voltage-controlled oscillator; herein, the frequency detecting circuit shuts down the charge pump so that the voltages v1 of the two ends of the capacitor c no longer changes. As a result, the frequency of the clock information clk outputted by the voltage-controlled oscillator no longer changes and thus maintains to be equal to the frequency of the reference data information data0, so as to lock the frequency.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:
1. A frequency locking system for locking a clock frequency in a clock and data recovery (CDR) circuit without crystal oscillator, comprising: a first low-pass filter, a first swing detector, a second low-pass filter, a second swing detector, a comparator, a charge pump, a voltage-controlled oscillator, a code pattern conversion generator and a capacitor;

wherein an input terminal of said first low-pass filter is inputted with reference data information; an output terminal of said first low-pass filter is connected to an input terminal of said first swing detector; an output terminal of said first swing detector is connected to a non-inverting input terminal of said comparator; an output terminal of said comparator is connected to an input terminal of said charge pump; an output terminal of said charge pump is connected to a first terminal of said capacitor; a second terminal of said capacitor is grounded; said first terminal of said capacitor is also connected to an input terminal of said voltage-controlled oscillator; an output terminal of said voltage-controlled oscillator is connected to an input terminal of said code pattern conversion generator; an output terminal of said code pattern conversion generator is connected to an input terminal of said second low-pass filter; an output terminal of said second low-pass filter is connected to an input terminal of said second swing detector; an output terminal of said second swing detector is connected to an inverting input terminal of said comparator; said first swing detector detects an amplitude of said reference data information which is filtered by said first low-pass filter to generate a first detection result, and then inputs said first detection result into said non-inverting input terminal of said comparator; said code pattern conversion generator converts a clock information which is generated by said voltage-controlled oscillator into a code pattern correspondently to said reference data information, and inputs said converted clock information into said second low-pass filter; said second swing detector detects an amplitude of said clock information which is filtered by said second low-pass filter to generate a second detection result, and inputs said second detection result into said inverting input terminal of said comparator; said comparator compares said amplitudes of said two inputted informations to generate a comparison result, and controls said charge pump to charge/discharge said capacitor according to said comparison result; and, said voltage-controlled oscillator adjusts a frequency of said clock information outputted thereby according to voltages of two ends of said capacitor.

2. The frequency locking system, as recited in claim 1, further comprising a trimming algorithm circuit, wherein an input terminal of said trimming algorithm circuit is connected to said first terminal of said capacitor; an output terminal of said trimming algorithm circuit is connected to a control terminal of said voltage-controlled oscillator, for adjusting a frequency range of said clock information outputted by said voltage-controlled oscillator; said trimming algorithm circuit has N scales, wherein N is a natural number larger than or equal to 1; when said trimming algorithm circuit detects that said capacitor charges to increase said voltages of said two ends to a highest value, or discharges to decrease said voltages of said two ends to a lowest value, said trimming algorithm circuit accordingly switches said scales, so as to adjust said frequency range of said clock information outputted by said voltage-controlled oscillator.

3. The frequency locking system, as recited in claim 2, wherein when said trimming algorithm circuit detects that said capacitor charges to increase said voltages of said two ends to said highest value, said trimming algorithm circuit raises said scale by one scale; and when said trimming algorithm circuit detects that said capacitor discharges to decrease said voltages of said two ends to said lowest value, said trimming algorithm circuit lowers said scale by one scale.

4. The frequency locking system, as recited in claim 3, further comprising a first switch and a second switch, wherein a first terminal of said first switch is connected to an external power source; a second terminal of said first switch is connected to said first terminal of said capacitor; a first terminal of said second switch is grounded; a second terminal of said second switch is connected to said first terminal of said capacitor; controls terminals of said first switch and said second switch are both connected to said trimming algorithm circuit; when said trimming algorithm circuit raises said scale, said first switch is opened and said second switch is closed; and when said trimming algorithm circuit lowers said scale, said first switch is closed and said second switch is opened.

5. The frequency locking system, as recited in claim 2, further comprising a frequency detecting circuit, wherein a first input terminal of said frequency detecting circuit is connected to said output terminal of said trimming algorithm circuit; a second input terminal of said frequency detecting circuit is connected to said first terminal of said capacitor; an output terminal of said frequency detecting circuit is connected to a control terminal of said charge pump; and, when said frequency detecting circuit detects that said scale of said trimming algorithm circuit stops changing and said voltages of said two ends of said capacitor stop changing, said frequency detecting circuit shuts down said charge pump.

* * * * *